United States Patent [19]

Yuen et al.

[11] 4,183,460
[45] Jan. 15, 1980

[54] IN-SITU TEST AND DIAGNOSTIC CIRCUITRY AND METHOD FOR CML CHIPS

[75] Inventors: Raymond C. Yuen, Poway; Mark A. Menezes, Rancho Bernardo, both of Calif.; Herbert Stopper, Orchard Lake, Mich.

[73] Assignee: Burroughs Corporation, Detroit, Mich.

[21] Appl. No.: 863,696

[22] Filed: Dec. 23, 1977

[51] Int. Cl.² ................. G01R 31/28; G06F 11/00
[52] U.S. Cl. ............................ 235/302; 324/73 R
[58] Field of Search ............... 235/302, 302.1, 304; 324/73 R, 73 AT

[56] References Cited

U.S. PATENT DOCUMENTS

| | | | |
|---|---|---|---|
| 3,582,633 | 6/1971 | Webb | 235/302 |
| 3,739,160 | 6/1973 | El-Hasan et al. | 235/302 |
| 3,815,025 | 7/1974 | Jordan | 324/73 R |
| 3,919,533 | 11/1975 | Einolf, Jr., et al. | 235/302 |
| 3,924,181 | 12/1975 | Alderson | 235/302 |
| 3,976,864 | 8/1976 | Gordon | 235/302 |
| 4,074,189 | 3/1978 | Harms et al. | 324/73 R |

OTHER PUBLICATIONS

Barnard & McMahon, Shift Register Tester on a Chip, IBM Technical Disclosure Bulletin, vol. 15, No. 9, Feb. 1973, pp. 2935-2936.

Leininger, On—Chip Testing Enhancement of a Single—Chip Microprocessor, IBM Technical Disclosure Bulletin, vol. 21, No. 1, Jun. 1978, pp. 5-6.

*Primary Examiner*—Charles E. Atkinson
*Attorney, Agent, or Firm*—Joseph R. Dwyer; Mervyn L. Young; Kevin R. Peterson

[57] ABSTRACT

An In-Situ Test and Diagnostic Circuit and Method to monitor the integrity of external connections of a current mode logic integrated circuit chip (inputs and outputs) as well as the integrity of the logic function thereof. The circuit comprises three parts: an "Open" Input Detector to detect open connections or connections that are becoming open between one chip and another; an Output Short Detector to monitor shorts at any chip output; and a Signature Test and Diagnostic circuit to determine if the logic function of the chip itself is operational. All the foregoing circuit parts are formed as an integral part of each CML chip and connected to an output terminal called a Test and Diagnostic Pin.

23 Claims, 6 Drawing Figures

IN-SITU TEST AND DIAGNOSTIC CIRCUITRY AND METHOD FOR CML CHIPS

BACKGROUND OF THE INVENTION

This invention relates to a means for testing and diagnosing integrated circuits (chips) and relates, in particular, to a means for locating open (disconnected) input terminals, or input terminals that are becoming disconnected, or locating openings in the interconnect between the input terminals and the output terminals of other chips, and means for locating shorted output terminals, as well as identifying chips whose logic function has become defective.

A number of means for testing the operational integrity of components or subsystems of data processing systems have been developed and the necessity for rapid and easy identification of defective chips has long been recognized.

A number of prior art test systems for diagnosing defective data processing components were mentioned by the inventors EL-Hasan and Packard in their U.S. Pat. No. 3,739,160 entitled, "Method and Apparatus for Fault-Testing Binary Circuit Subsystems" which issued on June 12, 1973. This patent also taught that a binary subsystem, by reason of its components and circuitry, had a character, or unique identification, in the form of binary signals generated thereby when a plurality of binary signals, in a known pattern, were applied cyclicly be a device, therein called a Word Generator. A defective subsystem was located by applying such a known pattern of binary signals cyclicly for a selected number of times, then comparing the signals generated by the subsystem with the character of binary signals derived under identical conditions from a known to be good binary subsystem. If there was no match, then a fault in the subsystem was indicated.

Recognizing this advance in the art by the aforementioned patent, the state of the art was advanced a step further by taking a given integrated circuit chip and identifying the unique pattern of binary signals that will appear on the terminals of the chip when selected binary signals, or routines, are cyclicly applied a selected number of times to the chip by a tester (Generator as referred to in the patent). Such a unique pattern is called character identification or Signature, and after cyclicly applying the routines, if the Signature is not realized, the logic function of the chip is determined to be defective. Thus, each chip, i.e., a memory circuit, a register circuit, a driver-receiver circuit, etc., has a unique Signature and there is a routine in the tester for each class of such chips. In addition, each chip has a pattern of binary signals, or codes, encoded thereon which will identify the class to which the chip belongs and this code can also be found again by cyclicly applying binary signals to the chip by the tester. Circuitry is also provided on the chip so that the Signature is recognized (or not recognized if the chip is malfunctioning) and the class code identified, on one output terminal.

Thus, utilizing this invention which forms part of the chip itself, a field technician is first able to identify the type chip he is testing and then, once having found the proper class of chip, is able to detect a malfunction of the logic circuitry, if any.

As hereinabove mentioned, however, also forming part of the chip, is circuitry which will enable the field technician to identify any disconnected inputs or shorted outputs of the chip before going through the process of identifying the chip class and signature. This, of course, enables the field technician to save the time and expense of testing a chip for logic malfunction in the event the problem lies in the area of a disconnect or short to and from the chip itself.

It is, therefore, a general object of this invention to provide a means for monitoring the integrity of the inputs and outputs of an integrated circuit chip as well as the integrity of the logic function of the chip.

A more specific object of this invention is to provide, in the integrated circuit chip itself, an Input Open Detector to monitor the chip for any input leads that are disconnected, or are becoming disconnected, and to indicate that such a disconnection or anticipated disconnection exists.

Still another specific object of the invention is to provide, in the integrated circuit chip itself, an Output Short Detector to monitor the chip for shorts at any chip output and to indicate that such a short exists.

Still another and very important object of this invention is to provide a Signature Test and Diagnostic circuit, forming part of the chip itself, to enable a technician to determine if the logic function of the chip itself is operational or whether it is malfunctioning.

Finally, another object of this invention is to provide means by which the Input Open Detector, the Output Short Detector and the Signature Test and Diagnostic circuit are implemented on only one terminal of the chip.

SUMMARY OF THE INVENTION

The invention, which accomplishes the foregoing objects, comprises an Input Open Detector, an Output Short Detector, and a Signature Test and Diagnostic Detector, all of which are connected to a single output lead called a Test and Diagnostic Pin and all of which form a part of an integrated circuit chip.

The Input Open Detector comprises a pair of current mode logic (CML) gates, one of which continually senses the state of the input lead of the chip and, in one state, continually draws a predetermined minimal amount of current from the output of another chip so as to continually sense the continuity of the connection to the input lead. This gate also serves as a current sink to drop the voltage at the input of a second CML gate in the event the chip input lead becomes more and more resistive thus anticipating an opening in the input connection, or in the event the input connection does become disconnected, so that the second gate, changing its normal operating state will send a warning signal to the Output Test and Diagnostic Pin.

The Output Short Detector continually monitors a pair of output leads through a voltage divider network to establish a voltage difference in the event that one or the other of the leads becomes shorted, which voltage difference causes a first sensor CML gate to change its normal state and, in turn, causes a second CML gate to send a warning signal to the Output Test and Diagnostic Pin by reason of the second gate changing its normal state.

Finally, the Signature Test and Diagnostic Detector includes a first AND gate, or buffer, to receive the outputs from the Input Open Detector and Output Short Detector as well as the inputs from a Class Code AND gate and a Signature AND gate. The output of this buffer AND gate, depending upon the signals received, changes the state of a CML gate which sends a signal to a Test and Diagnostic Pin. In the event that there is no fault in the input or the output of the chip, the Test and Diagnostic Pin, through the operation of two additional CML gates, enables the technician to identify the class of chip under test and, once having selected the proper class, to cycle the chip under test until the Signature thereof is generated and placed on the inputs to the Signature AND gate. If the correct Signature is not generated then, the technician has determined that a fault exists in the logic function of the chip under test.

BRIEF DESCRIPTION OF THE PREFERRED EMBODIMENTS

Figure 1:
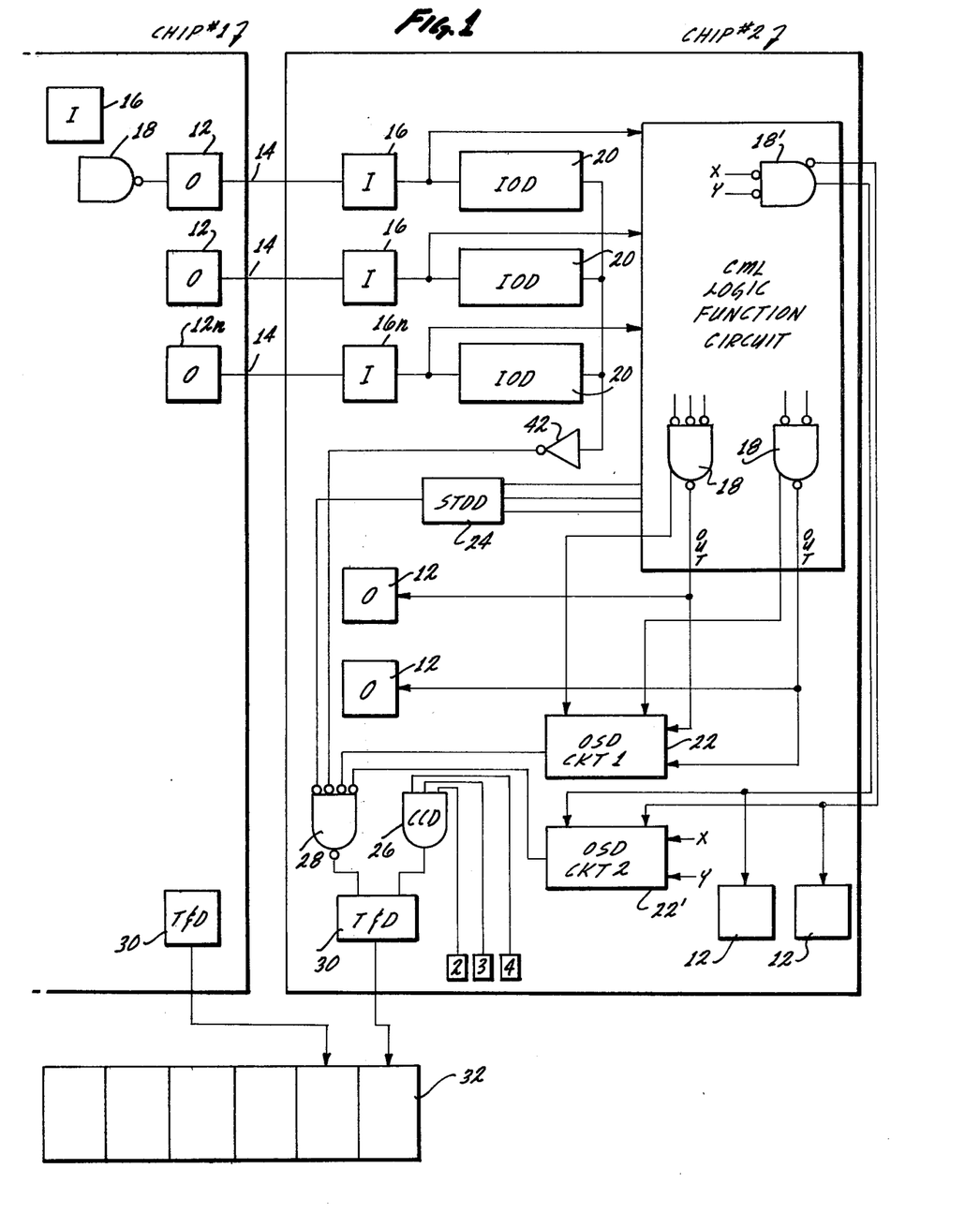
FIG. 1 is a schematic illustration of two CML chips typically connected together with an output of the first chip connected to an input of the second chip and with the invention shown on the second chip for illustrative purposes only.

Now, turning first to FIG. 1, there is disclosed a portion of a pair of typical CML chips 1 and 2. Chip 1, by way of example to illustrate the invention, has its output terminal 12, shown as a pad, connected by conductor line 14 to an input terminal 16, also shown as pad, of chip 2. Typically, each chip has a plurality of output terminal pads 12 and a plurality of input terminals pads 16; only a few of which are shown on chips 1 and 2 for clarity. The output pad 12 is connected to a typical CML output gate 18, (shown symbolically) while the input pad 16 of chip 2 is connected to an Input Open Detector (IOD) 20, also shown as a block diagram in this Figure. The circuitry of both the CML output gate 18 and the Input Open Detector 20 will be explained in more detail hereinafter.

Also shown in FIG. 1, to illustrate the invention, are Output Short Detectors (OSD) 22 and 22' illustrated as block diagrams and shown connected to two of the output pads 12. Also, chip 2 is provided with a Signature Test and Diagnostic Detector (STDD) 24 and a Class Code Detector 26 (CCD) which are also shown as block diagrams on chip 2. The Signature Test and Diagnostic Detector 24 is, of course, connected to the logic function circuitry of the chip since the STDD 24 is to identify any malfunction thereof. The Input Open Detector 20 (IOD), the Output Short Detectors (OSD) 22, 22', and the Signature Test and Diagnostic Detector (STDD) 24 are connected through a buffer 28 to an output terminal pad 30 called a Test and Diagnostic Pin (T&D). Finally, the Test and Diagnostic Pins 30 of a plurality of chips are connected to an indicia means 32 of any suitable type to indicate to an observer that an input is open or there is a short in the output of a particular chip.

As hereinabove explained, the purpose of the foregoing detectors on each of the chips is to enable a field service maintenance person to identify a malfunctioning chip in situ in a computer system by an output signal from the Test and Diagnostic Pin (T&D) such as, for example, an input, either the contact pad itself or part of the interconnect between another chip and the pad is open, or nearly open (becomes more resistive), or there is a short of some type on any output. In the event of a malfunctioning of the logic function circuitry of the chip itself, the T&D pin 30 is utilized to identify the malfunctioning chip in situ. How all this is accomplished will now be explained in more detail.

Thus, it should be understood that while the Input Open Detector 20 and the Output Short Detectors 22, 22' and the Signature Test and Diagnostic 24 circuits are shown only in chip 2, all chips may be provided with this circuitry and there is one Input Open Detector for each input pad 16–16n and in one embodiment there is one Output Short Detector for each pair of output pads 12–12n, and further that there is one Signature and Diagnostic circuit to test the integrity of the function of the chip located on each chip, all of which are connected to the Test and Diagnostic pad or pin (T&D). Two embodiments to the Output Short Detector are shown due to the fact that, in some instances, both the true output and its complement of the output gate 18, are coupled to two output pads. In order to cover one possible short, in this instance, where there is a short between true and its complement, a second embodiment is required. This is shown on chip 2 from output gate 18'.

In chip 2, the function of the chip is simply illustrated as CML logic function circuitry and illustrated as a block diagram for the purposes of illustrating this invention. The logic function of the chip could be any one of a number of functions in a computer.

It should also be understood that hereinafter the word "open" describing a pad or a lead includes, as an example, the possible disconnection between the output pad 12 of chip number 1 to the input pad of chip number 2 either, at the pads themselves, or in the connector, such as 14, therebetween. Also in the description hereinafter typically of CML gates, the normal voltage swing is approximately 400 mv and a "high" is logical 0 ($-40$ mV $\leq$ V $\leq$ 0.0 V) and a "low" is logical 1 ($-500$ mV $\leq$ V $\leq$ $-360$ mV).

Figure 2:
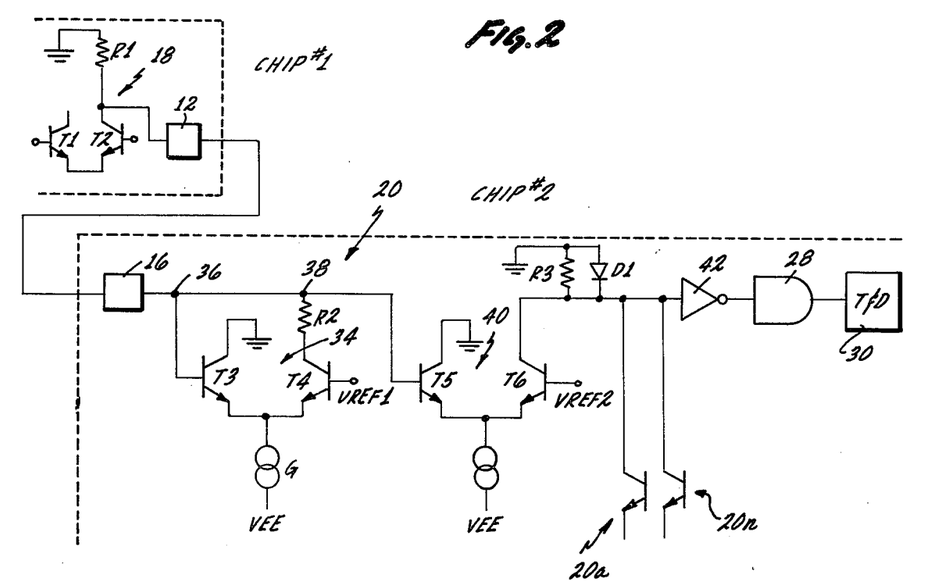
FIG. 2 is a detailed schematic circuit of one Input Open Detector (IOD) of the one input pad on the second chip connected to the output pad of the first chip, and this figure also shows the connection of this Detector with other Detectors and with the Test and Diagnostic Pin.

Turn now to FIG. 2 where one of the Input Open Detector circuits 20 is shown connected to one input terminal pad 16 of chip 2. There is an Input Open Detector circuit 20 for each of the inputs of the chip and, as shown, input pad 16 is connected via conductor 14 to output terminal 12 of chip number 1. Typically, each of the terminals 12 is connected to a CML output gate 18 which comprises a pair of differentially connected switching transistors T1 and T2 with the terminal 12 connected between the collector of transistor T2 and a driving resistor R1 which is in turn connected to a reference voltage, such as ground.

The circuit 20 comprises a first current switching device 34 (hereinafter such switching devices as 34 will be called CML gates) comprising a pair of differentially connected transistors T3 and T4 whose emitters are connected in common through a constant current source G to voltage supply VEE, which is negative with respect to ground. The base of transistor T3 is connected directly to the input pad 16 at node 36 while its collector is connected to a reference voltage such as ground. The transistor T4 has its base connected to a reference voltage supply VREF$_1$, negative with respect to ground, and its collector connected to the input pad 16 through a resistor R2 at node 38. Node 38 also connects a pair of differentially connected switching transistors T5 and T6 forming a second CML gate 40 to the input pad 16 and to CML gate 34. Transistors T5 and T6 are connected in common to the negative voltage supply VEE through a second current source G2 and the collector of transistor T5 is connected to the reference voltage, ground. The base of transistor T6 is referenced at a third reference voltage supply by VREF$_2$, more negative than VREF$_1$ and its collector is connected in a wired-OR arrangement with all other outputs from similar Input Open Detectors, such as 20a to 20n, through an inverter 42 and buffer 28 to the Test and Diagnostic Pin 30. The resistor-diode parallel connection R3 and D1 in the collector of transistor T6 provides the collector voltage level. As an example of the operation of the Input Open Detector 20, the output from chip 1 is received at the input 16 via the conductor 14. Thus, assuming typical CML values, the normal voltage swing is approximately 400 mV and the value of VREF$_1$ at the base of transistor T4 is −200 mV, the value of VREF$_2$ at the base of transistor T5 is −675 mV, and the current through current source G1 is 0.1 mA. Typically, too, R1=40 ohms and R2=300 ohms.

Thus, when the output from the output 12 is high (0.0 mV), the input and therefore the base of transistor T3 is "high" with the result transistor T3 is "on" and the current flows through T3; transistor T4 being "off" since its base is referenced at a lower value (VREF$_1$<0.0 V). Alternatively, when the input at pad 16 is low (−400 mV), since the base of transistor T4 is higher (VREF$_1$>400 mV) than the base of transistor T3, transistor T4 is "on" and current flows through transistor T4. Thus, the first CML gate 34 monitors the input 16 by drawing a predictable amount of current (0.1 mA) from the driving resistor R1 of the output gate 18 of chip 1 when the input 16 is low. This minimal amount of current (0.1 mA) is drawn through the resistor R1 via transistor T4 and resistor R2 so as not to degrade the output signal at pad 12.

During the foregoing high and low voltage swings, the current drain is, of course, switched between transistors T3 and T4. At this same time, this same voltage swing is seen by the base of transistor T5; however, since the base of transistor T6 is referenced at a lower voltage than the most negative voltage of the voltage swing (voltage REF$_2$ is more negative than −400 mV), transistor T6 will remain "off" until the base of transistor T5 is more negative than the base of transistor T6. Thus, the voltage on the collector of transistor T6 is normally HIGH since no current is flowing through transistor T6 until the base voltage in Transistor T5 is lower (i.e., <−675 mV).

Accordingly, in the event that the resistance of the input pad increases, as by corrosion for example, this increase in resistance will be reflected by an increase in voltage drop at node 38 and at the base of transistor T5. When the voltage at the base of transistor T5 reaches a point where it is more negative than the base of transistor T6. Transistor T5 is then turned "off" and transistor T6 is turned "on". The flow in current through transistor T6 will be reflected as a voltage drop at the collector in transistor T6 which will in turn be inverted by inverter 42 and reflected in the Test and Diagnostic Pin 30 where the normally low voltage will go "high".

Thus, the CML gate 40 is a sensor which senses any increase in resistance through pad 16. That is to say that sensor 40 not only detects open inputs, such as at 16, but anticipates an open in the case where the resistance is gradually increasing toward an open condition, as by corrosion, or by any other degradation of the conductivity of the input pin.

Figure 3:
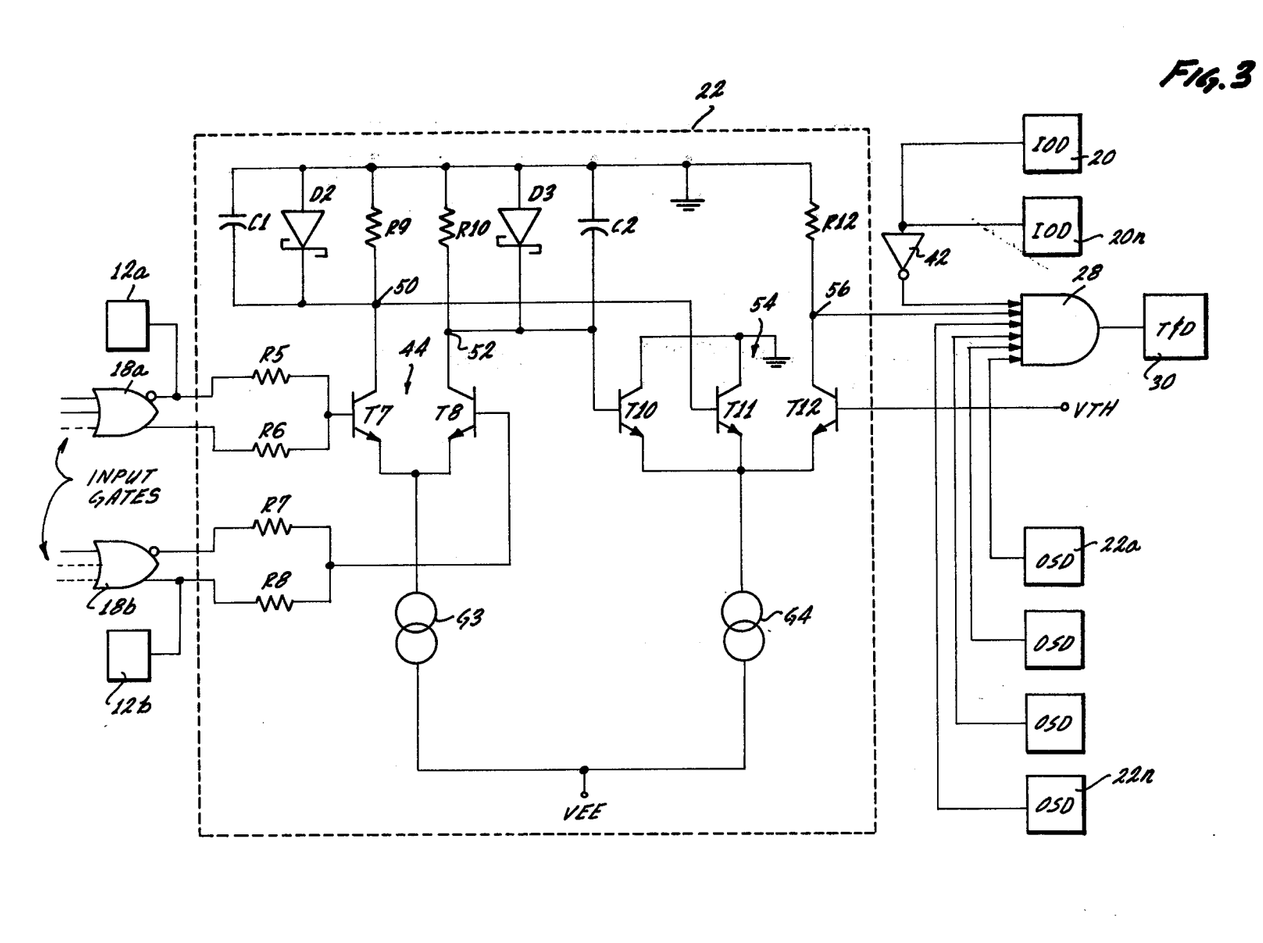
FIG. 3 is a schematic circuit of an Output Short Detector (OSD) for a pair of output pads where only one output from a pair of output gates is utilized.

Now as to the first embodiment of the Output Short Detector shown as a block diagram (OSD) 22 in FIG. 1, attention is now directed to FIG. 3 which discloses the circuitry of this embodiment of the detector 22 in detail. As mentioned before, this Output Short Detector 22 detects certain shorts at the output pads of the CML chip, i.e., shorts to ground, shorts to negative supply, and shorts to another output.

Typically, the output pads 12 (shown as 12a and 12b in this Figure) are each connected through a gate, such as 18a and 18b, (shown partly in FIG. 2 at 18 and shown as a logic symbol and identified as 18a and 18b in FIG. 3) which in turn is connected to the Output Short Detector 22. The detector circuit 22 comprises a first CML gate 44 in the form of a pair of differentially connected switching transistors T7 and T8 whose emitters are connected in common to a negative voltage source VEE through a current source G3. The base of transistor T7 of the CML gate 44 is connected to a voltage divider network comprising a pair of resistors R5 and R6 connected together in parallel at node 46. The sides of these resistors opposite the node 46 are in turn connected one to the inverted or complementary output from a first gate 18a and the other from the true output from this same gate 18a. Similarly, the base of transistor T8 is connected to a similar voltage divider network comprising resistors R7 and R8 connected in parallel at node 48 with the resistor R7 connected to the complementary output of a second gate 18b and resistor R8 connected to the true output from this same gate. Note that in this embodiment pad 12a is connected to the complement output of gate 18a while pad 12b is connected to the output at gate 18b. (This differs from the arrangement of the second embodiment of this detector which will be explained in detail hereinafter). The collector of transistor T7 is connected at node 50 to a first load resistor R9 which in turn is connected to a second reference voltage source, ground, while the collector of transistor T8 is connected at node 52 to a second load resistor R10 which also in turn is connected to the reference supply, ground.

Connected in parallel with each of the resistors R9 and R10, respectively, are Schottky diodes D2 and D3 and two capacitors C1 and C2. The collector of transistor T8, the resistor R10, the Schottky diode D3 and capacitor C2 are, in turn, connected in common to the base of transistor T10 of a second CML gate 54 comprising transistors T10, T11 and T12. Also, the collector of transistor T7, the Schottky diode D2, resistor R9 and capacitor C1 are also connected to the base of transistor T11 while the collectors of transistors T10 and T11 are connected to the second reference supply, ground. All emitters of transistors T10, T11 and T12 are connected in common to the negative voltage supply VEE through a current source G4. To complete the description of the circuit, the base of transistor T12 is connected to a threshold voltage VTH and its collector is connected first at node 56 ultimately to the Test and Diagnostic Pin 30 and then in series with a load resistor R12 and to ground.

As an example of the Output Short Detector shown above, the typical values involved are: the voltage swings at the output from gates 18a and 18b are 0.0 volts to a −400 mV; resistors R5–8 are each 1.7k ohms, resistors R9 and R10 are 2.5k ohms, resistors R11 and R13 are 400 ohms and resistor R12 is 800 ohms.

As to the operation of the Output Short Detector, both the true and complement outputs of the two gates 18a and 18b are directed to the two voltage divider networks comprising the four resistors R5 through R8. Normally, the outputs from these gates are such that the two transistors T7 and T8 are held in an "on" condition with the current flowing equally through both transistors. In this condition, transistors T10 and T11 are held "off" as their respective bases are more negative (lower) than the threshold voltage of VTH (−200 mV) on the base of transistor T12. Thus, like the CML gate 40 of the Input Open Detector, CML gate 44 acts as a sensor. However, if any one of the true or complementary outputs from the gates 18a or 18b is shorted so as to allow the base of either transistor T7 or T8 to become "high", the other transistor of the CML gate 44 will turn "off" in which case the voltage at node 50 and 52 will go "high" with the result that one or the other of the current steering transistors T10 or T11 will go "on" stopping the current flow through transistor T12 by virtue of the base voltage reference VTH being lower than the voltage on the base of either transistor T10 or T11. In this case, the voltage at node 56 will go "high" since the current through transistor T12 has stopped, raising the normally low voltage level at the Testing Diagnostic Pin 30 indicating a fault or a short at one of the two output gates.

It should be noted at this time that the capacitors C1 and C2 connected in parallel with the two Schottky diodes D2 and D3 with resistors R9 and R10, respectively, have for their purpose the elimination of a false signal due to a switching condition that might be induced by reason of coaxial lines which may be connected to the output gates and which, to the CML gate 44, may look like a short. The two capacitors increase the time constant of the collector resistor diode network so that it takes a longer time to rise to and above the threshold voltage VTH on the base of transistor T12 before the other transistors T10 and T11 will go "high".

Before going on, Output Short Detector 22, it will be noted, monitored a pair of output gates 18a and 18b where only one of the outputs from each gate is connected to the outside world and such a detector would monitor such fault conditions, such as, short to ground, short to negative supply, shorts to another output, but in a case where both of the outputs from a CML gate such as 18′, (see FIG. 1) i.e., both its true and complement, were brought to the outside world, there is a possibility that these two outputs might short to one another and the circuit in FIG. 3 would not detect this fault condition. As a consequence, the second embodiment of this Output Short Detector 22′ is a modification of the circuit of FIG. 3 and attention is now directed to FIG. 4.

Figure 4:
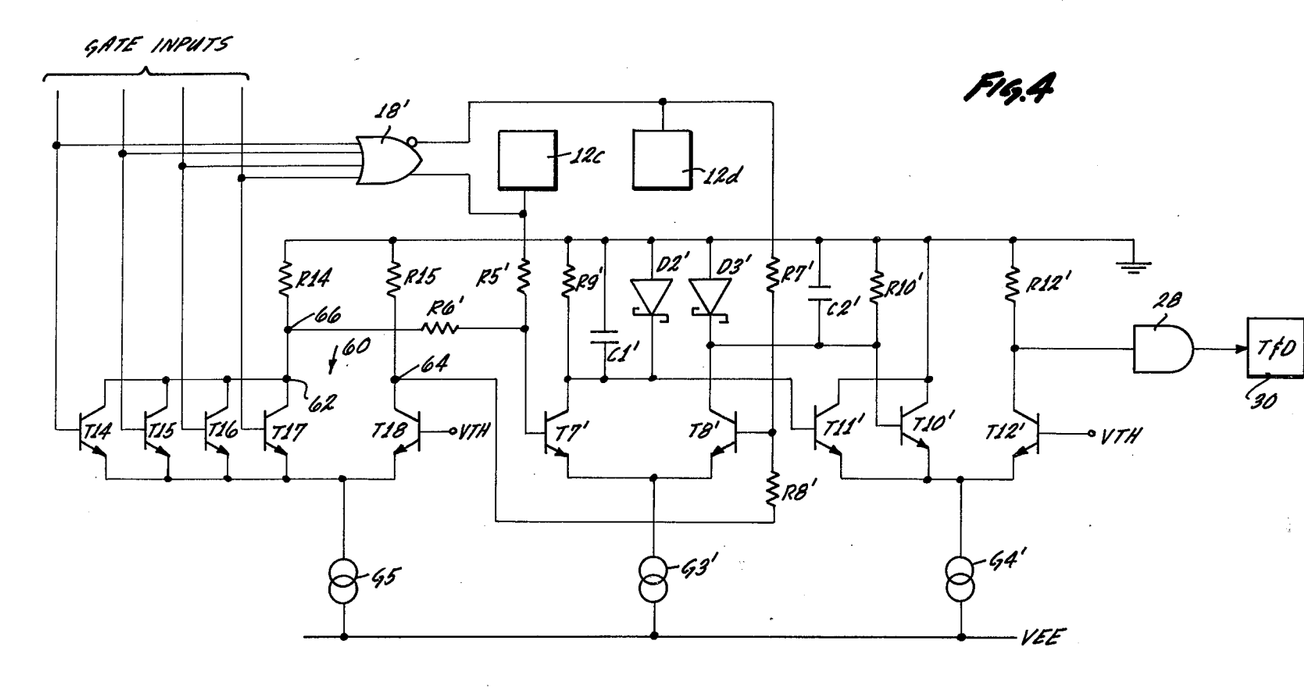
FIG. 4 is a detailed schematic circuit of another embodiment of an Output Short Detector (OSD) utilized when both outputs from an output gate are connected to output terminal pads.

In FIG. 4, it can be seen that both pads 12c and 12d are connected, respectively, to only one output gate 18′ and thus both the true and complement from the output gate 18′ are connected to the outside world. However, to identify the possibility of a short between the true and complement outputs, the inputs to the output gate 18′ are essentially duplicated by an internal CML gate 60 comprising transistors T14 through T17 whose emitters are coupled in common with the emitter of transistor T18 in a current steering relationship.

The base of transistor T18 is referenced at a threshold voltage VTH, and the bases of transistors T14 through T17 are connected to the gate input to the output gate 18′. The collectors of transistors T14 through T17 are connected in common at node 62 through a load resistor R14 to ground. Similarly, the collector to transistor T18 is connected to ground through a load resistor R15 and also at node 64 to resistor R8′ which is one of a pair of voltage divider networks R7′ and R8′ while the collectors of transistors T14 through T17 are connected at node 66 to resistor R6′ which is one of a pair of resistors R5′ and R6′ of the second voltage divider network. Thus, there are two voltage divider networks comprising of resistors R5′ through R8′ which correspond to the similarly numbered resistors in the circuit of FIG. 3. Thus, except for an additional current source G5 connected to voltage supply VEE to supply a constant current to the emitters of transistors T14 through T18, the Output Short Detector of FIG. 4 operates identically with that shown in FIG. 3 and the reference numerals used in this Figure for the components which function the same as in FIG. 3 have been given the same reference numeral except for the prime.

Figure 5:
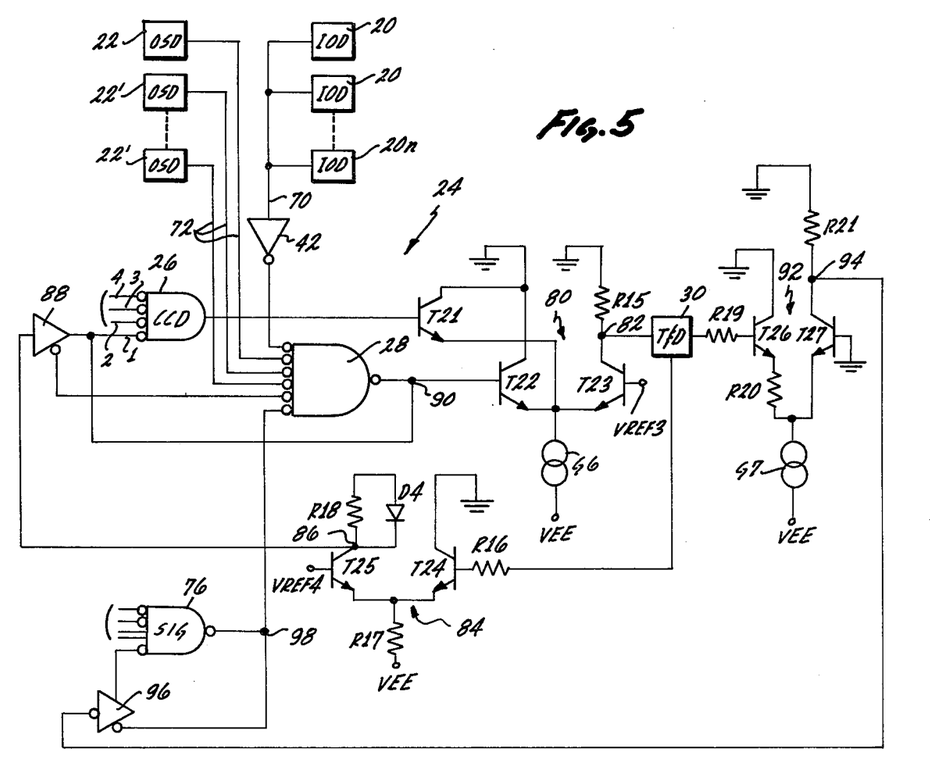
FIG. 5 is a detailed schematic illustration of a Signature Test Circuit (STDD) to test the functionality of the chip and shown connected to the Test and Diagnostic Pin (T&D).

Attention is now directed to FIG. 5 which shows the Signature Test and Diagnostic Circuitry 24 (STDD) including the Class Code gate 26 of FIG. 1 in detail. In this Figure, all outputs from the Input Open Detectors 20-20n are shown on conductor 70 and outputs from the Output Short Detectors 22 and/or 22′ are shown on one conductor 72 entering a negative AND gate previously called buffer 28. The Class Code (CCD) gate 26 is a negative NAND gate and a third negative AND gate 76, called the Signature Gate (SIG), is coupled to the NAND gate 28. NAND gate 26 has three of its four input conductors identified as 2, 3, and 4 (in this Figure and in FIG. 1) to represent the pads on the chip which are dedicated to the identification of the class of the chip, i.e., a register chip, memory chip, driver-receiver chip, or combinational chip (of the three input conductors it can be appreciated that the identification of eight chip classes are possible). The plurality of inputs to the AND gate 76 are connected to the pads of the chip and represent the Signature (identification) of a particular chip.

The output of the negative NAND gate 26 is connected to the base of transistor T21 and the output of AND gate 28 is connected to the base of transistor T22 of a CML gate 80 comprising transistors T21, T22 and T23 connected in current steering relationship. The emitters of transistors T21, T22 and T23 are connected in common to a constant current source G6 and to a negative voltage supply VEE and the base of transistor T23 is connected to a reference voltage VREF$_3$. The collector of transistor T21 and T22 are connected to ground while the collector of transistor T23 is connected directly to the Test and Diagnostic Pin 30 at node 82. Resistor R15 is connected at one end to node 82 and at the other end to the reference source, ground.

The Test and Diagnostic Pin 30 is also connected to the base of transistor T24 through base resistor R16, a second CML gate 84 comprising of a pair of transistors T24 and T25 whose emitters are connected in common to a negative voltage VEE through an emitter resistor R17. The base of transistor T25 is connected to a reference voltage VREF$_4$. The collector of transistor T24 is connected to the reference source, ground, while the collector of transistor T25 is connected at node 86 to a resistor-diode combination R18 and D4, the latter clamping the voltage level for the collector of transistor T25. Node 86 from CML gate 84 is also connected to an inverter 88 having an inverted output connected to the buffer 28 and a non-inverted output connected to the NAND gate 26 (CCD) as one of the four inputs thereto, and connected also at node 90 to the base of transistor T22 of CML gate 80, node 90 being located between the output of buffer 28 and transistor T22 to form a wired-OR connection.

Further, the Test and Diagnostic Pin 30 is connected to the base of one of a pair of transistors T26 and T27 forming a third CML gate 92 through a base resistor R19 located between the pin 30 and the base of the transistor T26. The emitter of the first transistor T26 is connected through an emitter resistor R20 to a constant current source G7 and to voltage supply VEE while the emitter of transistor T27 is connected directly to source G7 and to the resistor R20. The collector of transistor T26 is connected to the reference supply, ground, while the base of transistor T27 is connected to the same reference source, ground, and the latter's collector is connected at node 94 to one end of a load resistor R21 and then to ground. The collector of transistor T27 is also connected at node 94 to an inverter 96 having one inverted output connected to an input to the AND gate 76 (SIG) and another output and connected at node 98 to the output of the AND gate 76 forming a wired-OR arrangement thereat.

Typical values in the circuit 24 of FIG. 5 are: VREF$_3$ connected to the base of transistor T22 is −200 mV and VREF$_4$ is −800 mV and resistors R20 and R21 are 400 ohms while resistor R15 is 40 ohms.

Figure 6:
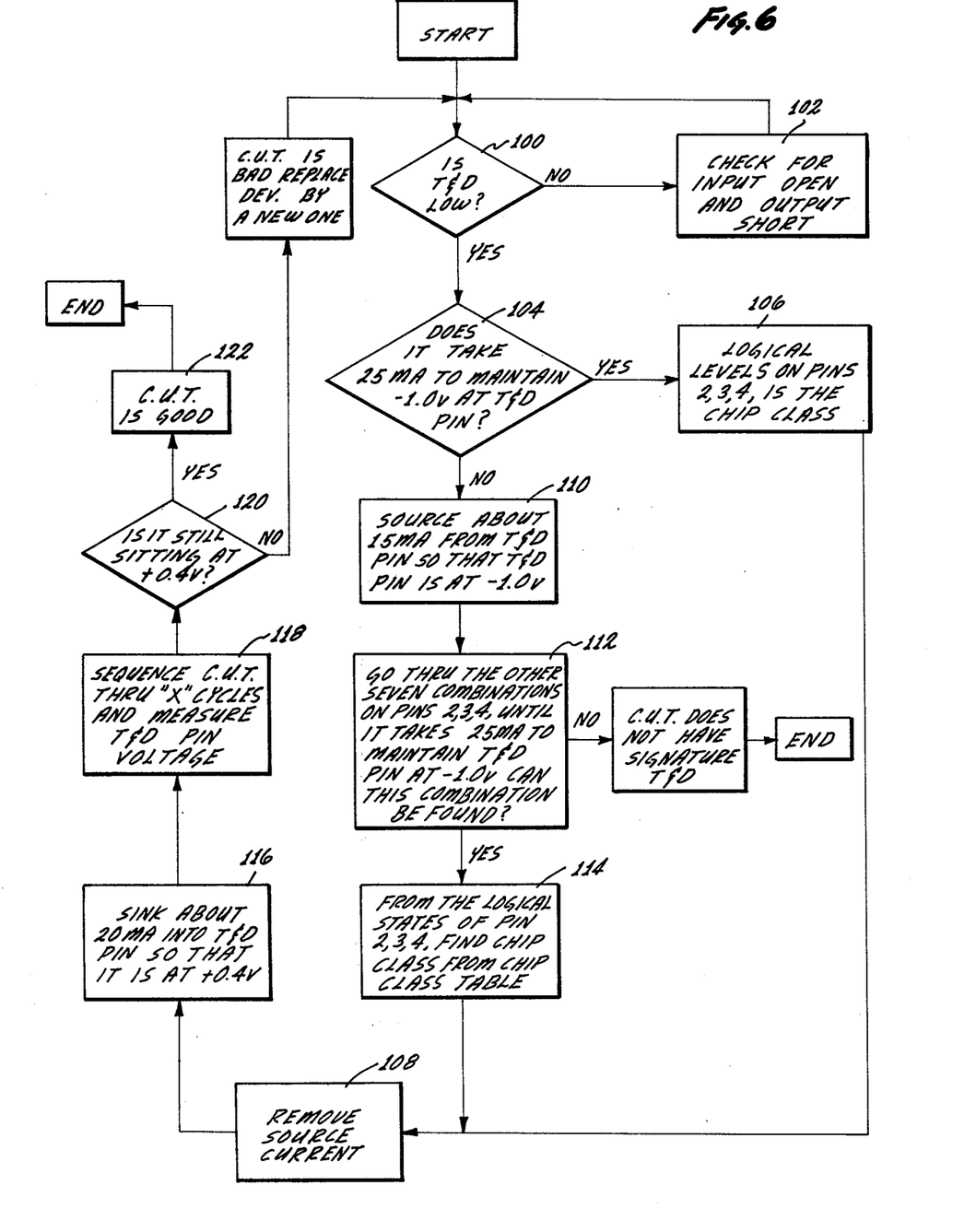
FIG. 6 is a flow chart for the Testing and Diagnosing a chip in situ utilizing the foregoing Detectors.

As to the operation of the Signature Test and Diagnostic circuit 24, reference should also be made to the flow chart, FIG. 6. Taking these two FIGS. 5 and 6 together, an explanation evolves as to the manner in which a field service man would test a chip in-situ.

It will be recalled with reference to FIG. 1 that in the event a fault occurs whether by an input pad being open or an output short of any type, a signal will be presented to an observer by the indicia means 32. Thus, referring to the flow chart of FIG. 6, the first decision block 100 wherein the process of diagnosing a chip under test begins, the first question is whether or not the Test and Diagnostic Pin is HIGH or LOW (0.0 volts or −400 mV). Since the Test and Diagnostic Pin 30 should normally be LOW, if it is HIGH, then the observer, as indicated in the process block 102, will check for an input "open" or output "short" which results from the operation of the circuitry explained in connection with the preceeding FIGS. 2, 3, and 4 and possibly that the entire diagnosis will end at this point.

In looking at the circuit in FIG. 5, it should be pointed out first that in gate 80 the voltage VREF$_3$ on the base of transistor T23 is normally "high" relative to the bases of transistors T21 and T22 so that the current from the constant current source G6 normally flows through transistor T23 rendering node 82 at low voltage. Also on CML gate 84, the voltage VREF$_4$ applied to the base of transistor T25 is normally lower (VREF$_4$=−800 mV) than the normal voltage swings on the base of transistor T24 (0.0 V to −400 mV) so that the current from the resistive current source R17 normally flows through transistor T24 leaving the node 86, connected to the normally "off" transistor T25; being at a HIGH state. Also in CML gate 92, with the base of the transistor T27 connected directly to ground, transistor T27 is normally "on" and current from the constant current source G7 flows therethrough with node 94 being in a low state, transistor T26 being the "off" transistor.

In further looking at the circuit in FIG. 5, it can be seen that the outputs from circuits 20 enter the input line 70 to the AND gate 28 through an inverter 42 and the outputs from circuits 22 and/or 22' are connected by input lines 72 to the AND gate 28. Line 70 is normally at a high voltage (0.0 mV) and lines 72 are normally LOW when there is no fault on any of the inputs or outputs of the chip under test and the output from the AND gate 28 is normally LOW (all other inputs being normally LOW as will be clear from a further discussion hereinafter). The output of AND gate 28 is connected to the base of transistor T22, the normally "off" transistor, of CML gate 80. However, if either of the inputs to the AND gate 28 from IOD and OSD become HIGH by reason of a fault at one of the inputs or outputs of the chip under test, AND gate 28 is disabled causing its output to go HIGH (i.e., more positive than VREF$_3$ which is at −200 mV), turning transistor T22 "on" so that current flows therethrough and the current flow through T23 is stopped. The stoppage of the current through transistor T23 renders the collector voltage at node 82 to go "HIGH" and the Test and Diagnostic Pin 30 to go high, enabling the indicia means 32 (FIG. 1) as above stated.

In the event that the Test and Diagnostic Pin is LOW yet it is apparent that the chip under test is malfunctioning, a voltage source is attached to the Test and Diagnostic Pin 30. This voltage source can be any suitable regulated DC power supply capable of providing ±1.0 V at 0–25 mA with voltage and current meters so that the voltage and current may be monitored. This is a step as provided in decision block 102. At the same time a probe (not shown) with pins (leads) corresponding in number to the number of input and output pads (or pins) of the chip under test is connected to the chip under test without pulling the chip out of its connector (socket) or disconnecting the chip from the circuitry to which it is connected, if it is hardwired into a board.

It can be seen by the decision block 104 of FIG. 6, if it takes 25 mA to maintain −1.0 V at the Test and Diagnostic Pin 30, the technician can discern that the proper class of chip has been identified. See process block 106.

A chip class is identified by impressing a voltage on each of the dedicated pads of a chip under test by the probe in an order selected by the operator. These dedicated pads are identified as inputs 2, 3, and 4 on the Class Code NAND gate 26 (CCD) (see also FIG. 1) and this is done by providing a sequence of highs and lows (voltages or binary bits) so that the outputs from the pins of the chips (inverted if necessary) will become all LOW on the conductors 2, 3, and 4. The selection of the sequences of voltages on the dedicated pins can be the result of the operator's own experience in servicing the computer facilities where the chip is located, or similar facilities as the case may be, and if the selection is correct 25 mA will be required to maintain the −1.0 voltage on the Test and Diagnostic Pin 30.

The reason for this requirement of 25 mA will be clear with reference again to FIG. 5 where it can be seen that the −1.0 V applied to the Pin 30 rendering the base of the normally "on" transistor T24 of the gate 84 more negative (−1.0 V is more negative than the voltage REF$_4$ of −800 mV) so that transistor T24 will go to an "off" condition and the current will flow through the now "on" transistor T25. This current flow is reflected in that the voltage at node 86 going LOW which in turn is reflected as a low input to Class Code gate 26 by reason of the non-inverting output of inverter 88. Also, the non-inverting output from inverter 88 places a low voltage at node 90 and on the base of transistor T22 of gate 80 which the inverting output of inverter 88 places a high voltage at buffer 28 rendering its output HIGH; however, since the output of the buffer 28 and the output from the non-inverting output of inverter 88 are connected at node 90 in a wired-OR arrangement the voltage at the base of transistor T22 remains LOW.

Since the line 1 input to NAND gate 26 (CCD) is now LOW and, if the Class Code of the chip has been selected correctly, all inputs to the NAND gate 26 will be rendered LOW. The output from gate 26, which is connected directly to the base of transistor T21 of the CML gate 80, now being HIGH, turns the normally "off" transistor T21 to an "on" state so that current flows from the current source G6 through transistor T21 to ground. At the same time, the normally "on" transistor T23 is turned "off" so that the current from the power supply applied to the Test and Diagnostic Pin of 25 mA flows through R15 into ground (−1.0 V at 25 mA through 40 ohms; the value of R15).

If the proper Class Code of chip had not been selected and any one of the inputs 2, 3, and 4 to the NAND gate 26 would have remained HIGH so that the base of the normally "on" transistor T23 would have remained "on", the result would have been that inverting the current of 25 mA, sourced from the Test and Diagnostic Pin 30 by the power supply, would flow to ground but also the current through transistor T23 would flow to ground indicating a less than 25 mA reading on the current meter of the power supply. This, of course, would indicate to the observer that the proper class code had not been selected.

If the proper class code has been selected by the process above, as indicated in FIG. 6, the next step is indicated in block 108, i.e., remove the source current. On the other hand, if the proper class code of a chip has not been selected, reference is now made to decision block 110 which indicates that the current on the Test and Diagnostic Pin 30 should be reduced to something less than 25 mA, such as 15 mA.

At this step in the process, the other seven combinations on pins 2, 3, and 4 are cycled, i.e., selected HIGHS and LOWS in various orders are placed on pins 2, 3, and 4, until the proper chip class code is ultimately found. At this time the operator stops cycling the pins by reason of the fact that to keep a −1.0 V reading on the power supply, the amperage must be increased to 25 mA by reason of the operation of gate 26 (transistors T25 of CML gate 84 having remained ON by reason of the −1.0 V still being applied to the Test and Diagnostic Pin 30). In the event that the proper class code cannot be identified from the known class codes, as indicated in decision block 112, the operator will know that the signature of the chip under test is unknown and if a defect is still suspected, the chip should be replaced.

On the other hand, if the chip class has been identified, (since the operator will know from the order of HIGHS and LOWS applied to the dedicated pins of the chip under test), the next step is identified in process block 114, where the operator sets the tester to perform a known routine cyclic application of high and low voltages to obtain the Signature of the chip. The chip class, of course, can be identified either before or after the negative voltage supply is removed from the Test and Diagnostic Pin 30 since now the operator has arrived at the previously identified step, decision block 108.

The removal of the −1.0 volts from the pin 30 returns the CML gate 84 to its normal operating condition, i.e., transistor T25 is OFF and transistor T24 is ON. Also, the transistor T23 of CML gate 80 returns to its normal state since the voltage applied to the base of transistor T21 is now lower than the voltage of VREF3 applied to the base of transistor T22.

As shown in block 116, the next step is to change the polarity of the current applied to Test and Diagnostic Pin 30 and to apply (sink) 20 mA into the pin 30 and the reading on the tester voltmeter is monitored at +0.4 V. This positive voltage is seen at node 82 by the current flowing through transistor T23 of 10 mA and 10 mA flowing through resistor R15 to ground. At the same time the positive voltage of +0.4 V turns the normally "off" transistor T26 of CML gate 92 to an "on" condition since its base voltage is now higher than the ground voltage applied to the base of transistor T27. The rendering of transistor T27 "off" increases the voltage at node 94 on the collector of transistor T27 to a high condition (0.0 V) which is inverted by inverter 96 to apply a low voltage at the input of Signature AND gate 76 enabling the gate 76 to receive the Signatures of the chip which are now cycled by the operator. When the inverted output from inverter 96 went low, the non-inverted output at node 98 went HIGH and thus combined with the normally HIGH output from gate 76 will place a HIGH on buffer 28 which will remain HIGH until the inputs to gate 76 all go LOW, thereupon node 98 will go LOW as a function of the wired-OR arrangement.

The system now being ready for cycling of the Signatures as seen in block 118, the operator sequences the chip under test through a number of cycles (found to be approximately 65K cycles) at which time the Signature of the chip should be presented as all LOWS to the input lines of the AND gate 76. At this time, if the voltage on the Test and Diagnostic Pin 30, as can be seen by decision block 120, is still at +0.4 V (since all inputs to the buffer 28 are now low) the operator discerns that the proper Signature was presented to the AND gate 76 and therefore, according to the process block 122, the chip under test is functioning correctly. In the event that there is a malfunctioning of the chip and the Signature presented to the gate 76 is incorrect, the voltage on Pin 30 will not be at +0.4 V which indicates that the chip is malfunctioning and should be replaced.

Once the chip has been replaced, the process is started over again to see that the newly replaced chip is not functioning correctly.

What is claimed is:

1. In an integrated circuit chip having logic function circuitry for performing a function in a data processing system, having a signature correlated to its logic function circuitry, having a class code means encoded thereon which in response to signals applied from an external source will generate a pattern of binary signals identifying the type of chip involved, and further having a plurality of input and output means for connecting said chip to external devices, comprising:

fault sensing and test circuit connected to a selected one of said output means, said sensing and testing circuitry including, means connected to said input means and said selected output means for sensing a fault at said input means and generating a signal at said selected output means;

means connected to said output means and said selected output means for sensing a fault at the unselected output means and generating a signal at said selected output means;

means connected to said class code means and to said selected output means for determining the class of chip containing said fault sensing and test circuitry and for generating a signal at said selected output means when the proper class of chip is selected; and means connected to said logic function circuitry and to said selected output means responsive to signals applied to said selected output means for recognizing the signature of said chip thus detecting any fault in the logic function circuitry of said chip.

2. The circuit as claimed in claim 1 wherein said means for sensing a fault at said input means comprises a first and second logic gate, said first gate being connected to said input means and to said second gate for sensing an increase in resistance at said input means and changing the state of said second gate in response to said increase so that the second gate will supply said signal to said selected output means.

3. The circuit as claimed in claim 1 wherein said means for sensing a fault at the unselected output means comprises first and second logic gates and voltage sensing means connected to said output means, each gate having an initial state by operation of said voltage sensing means, said first gate being connected to said voltage sensing means and to said second gate for sensing an abnormal change in the voltage level at said output means and changing the state of said second gate in response to said abnormal voltage change so that the second gate will supply said signal to said selected output means.

4. The circuit as claimed in claim 3 wherein said first gate and voltage sensing means are connected to a pair of unselected output means.

5. The circuit as claimed in claim 3 wherein said first gate and voltage sensing means are connected to a single unselected output means.

6. The circuit as claimed in claim 1 wherein said means for determining the class of chip comprises a logic gate connected to said selected output means, circuit means for maintaining said gate in one state when a selected current and voltage level of a given polarity is applied to said selected output means and for changing said gate to a second state while said selected current and voltage is applied when the proper class of chip is selected.

7. The circuit as claimed in claim 1 wherein said means responsive to signals applied to said selected output means for recognizing the signature of said chip comprises first, second and third logic gates, each connected to said selected output means, circuit means for maintaining each gate in an initial state on the application of a selected current level and of a given polarity to said selected output means, and means for changing the state of one of said gates to a second state when the signature of said chip is recognized.

8. The circuit as claimed in claim 7 wherein said first gate of said means for recognizing the signature of said chip is part of the same gate in said means for determining the class of chip and wherein the given polarity of the current for selecting said signature is the opposite of the given polarity of the current for determining the class of chip.

9. The circuit as claimed in claim 2 wherein said first gate comprises first and second transistors connected in current steering relationship and said second gate comprises third and fourth transistors connected in current steering relationship, the base of said first transistor and said third transistor being connected to said input means while the base of said second transistor and said fourth transistor are connected to sources of different voltage levels so that said first gate will respond to an increase in resistance at said input means and change state prior to any change of state in said second gate.

10. The circuit as claimed in claim 3 wherein said first gate comprises a first and second transistor connected in current steering relationship, and said voltage sensing means comprises a pair of voltage divider networks, the base of the first transistor being connected to the first voltage divider network and the base of the second transistor being connected to the second voltage divider network and wherein said second gate comprises third, fourth and fifth transistors with the third and fourth transistors connected to the fifth transistor in current steering relationship and wherein the bases of the third and fourth transistors are connected to the collectors of the first and second transistors such that the change of state of the first gate will change the state of the second gate so that the fifth transistor will supply said signal to said selected output means.

11. The circuit as claimed in claim 6 wherein said gate comprises first and second transistors connected in current steering relationship with the base of said first transistor being connected to a NAND gate and the base of the second transistor being connected to a source of voltage of a given level, the collector of said second transistor being connected to said selected output means, said gate being in an original state when a given voltage and current are applied to said selected output means and will change to a second state when selected logic signals are applied to the input of said NAND gate.

12. A circuit as claimed in claim 7 wherein each of said gates have pairs of transistors connected in current steering relationship, the collector of one of the transistors of the first gate being connected to said selected output means, an AND gate, the base of said transistor being connected to a first voltage source while the base of the other transistor is connected to the output of said AND gate, the base of one of the transistors of said second gate being connected to said selected output means while the base of the other transistor is connected to a second voltage source, the base of one of the transistors of the third gate being connected to said selected output means while the base of the other transistor is connected to a third voltage source, the collector of said latter transistor to said AND gate so as to effect the output of said AND gate to said first gate and a second AND gate for receiving the signature input signals thereof the output of said second AND gate being connected to said first AND gate so the current of a given amount and polarity applied to said selected output means will respond as a voltage of a known level if the signature of said chip is recognized.

13. In an integrated circuit having logic function circuitry for performing a function in a data processing system and having plurality of input and output means for connecting said integrated circuit to other devices in said system; fault sensing circuitry connected to a selected one of said output means and to said input means for sensing a fault at said input means and generating a signal at said selected output means.

14. The circuit as claimed in claim 13 wherein said means for sensing a fault at said input means comprises a first and second logic gate, said first gate being connected to said input means and to said second gate for sensing an increase in resistance at said input means and changing the state of said second gate in response to said increase so that the second gate will supply said signal to said selected output means.

15. In an integrated circuit having logic function circuitry for performing a function in a data processing system and having a plurality of input and output means for connecting said integrated circuit to other devices in said system, fault sensing circuitry connected to a selected one of said output means and to the unselected output means for sensing a fault at the unselected output means and generating a signal at said selected output means.

16. The circuit as claimed in claim 15 wherein said means for sensing a fault at the unselected output means comprises first and second logic gates and voltage sensing means connected to the unselected output means, each gate having an initial state by operation of said voltage sensing means, said first gate being connected to said voltage sensing means and to said second gate for sensing an abnormal change in the voltage level at the unselected output means and changing the state of said second gate in response to said abnormal voltage change so that the second gate will supply said signal to said selected output means.

17. In an integrated circuit chip having logic function circuitry for performing a function in a data processing system and having a class code means encoded thereon which in response to signals applied from an external source will generate a pattern of binary signals identifying the type of chip involved, and further having a plurality of input and output means; fault sensing and test circuitry connected to a selected one of said output means and to said class code means and means for determining the class of chip containing said fault sensing and test circuitry by generating a signal at said selected output means when the proper class of chip is selected.

18. The circuit as claimed in claim 17 wherein said means for determining the class of chip comprises a logic gate connected to said selected output means, circuit means for maintaining said gate in one state on the application of a selected current and voltage level of a given polarity to said selected output means and for changing said gate to a second state when the proper class of chip is selected.

19. In an integrated circuit chip having logic function circuitry for performing a function in a data processing system and having a signature correlated to its logic function circuitry, and further having a plurality of input and output means for connecting said chip to other devices in said system; means responsive to signals applied to a selected output means for recognizing the signature of said chip thus detecting any fault in the logic function circuitry of said chip by generating a signal at said selected output means.

20. The circuit as claimed in claim 19 wherein said means responsive to signals applied to said selected output means for recognizing the signature of said chip comprises first, second and third logic gates, each connected to said selected output means, circuit means for maintaining each gate in an initial state on the application of a selected current level of a given polarity to said selected output means, and means for changing the state of one of said gates to a second state when the signature of said chip is recognized.

21. In an integrated circuit having logic function circuitry for performing a function in a data processing system having a signature correlated to its logic function circuitry and further having a plurality of input and output means; fault sensing circuitry connected to a selected one of said output means, means connected to said input means and said selected output means for sensing a fault at said input means and generating a signal at said selected output means, fault sensing circuitry connected to said selected output means and to the unselected output means for sensing a fault at the unselected output means and generating a signal at said selected output means.

22. A method of testing an integrated circuit chip having a class code encoded therein indicating the type of logic function embodied in said circuitry by generating a plurality of binary signals when signals from an external source are applied to said chip, said chip also having a plurality of input and output means, comprising the steps of:
measuring the current and voltage levels at a selected output means on said chip and determining if said measurements are at predetermined levels,
applying a current of a first polarity on said selected output means and applying a plurality of logic signals on selected input means of said chip until the voltage on said selected output means reaches a predetermined value thus determining the class of chip by recognizing the class code on said chip.

23. The method as claimed in claim 22 further including the step of applying a current of a second polarity to said selected output means, cyclicly applying logical signals to the input means of said chip a given number of times to develop signature output logic signals from said chip, and measuring the voltage on said selected output means while holding said current of said second plurality on said selected output means to thus determine whether or not the logical function of the circuit is faulty.

* * * * *